(12) United States Patent
Chen et al.

(10) Patent No.: US 9,041,077 B2
(45) Date of Patent: May 26, 2015

(54) SEMICONDUCTOR DEVICE AND MANUFACTURING METHOD OF THE SAME

(71) Applicant: MACRONIX INTERNATIONAL CO., LTD., Hsinchu (TW)

(72) Inventors: Shih-Hung Chen, Hsinchu County (TW); Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 2 days.

(21) Appl. No.: 14/016,308

(22) Filed: Sep. 3, 2013

(65) Prior Publication Data

US 2015/0060958 A1    Mar. 5, 2015

(51) Int. Cl.
*H01L 29/76* (2006.01)
*H01L 21/28* (2006.01)
*H01L 29/78* (2006.01)

(52) U.S. Cl.
CPC .......... *H01L 21/28008* (2013.01); *H01L 29/78* (2013.01)

(58) Field of Classification Search
CPC .............. H01L 21/0257; H01L 21/242; H01L 21/2822; H01L 21/3215; H01L 21/38
USPC ........................................................ 257/288
See application file for complete search history.

(56) References Cited

U.S. PATENT DOCUMENTS 5,357,459 A * 10/1994 Chapman ...................... 365/149
8,503,213 B2    8/2013 Chen et al.

OTHER PUBLICATIONS

U.S. Appl. No. 13/078,311, filed Apr. 1, 2011.
U.S. Appl. No. 13/729,092, filed Dec. 28, 2012.

\* cited by examiner

*Primary Examiner* — Elias M Ullah
(74) *Attorney, Agent, or Firm* — McClure, Qualey & Rodack, LLP

(57) ABSTRACT

A semiconductor device and a manufacturing method of the same are provided. The semiconductor device includes a substrate and a stacked structure vertically formed on the substrate. The stacked structure includes a plurality of conductive layers and a plurality of insulating layers, and the conductive layers and the insulating layers are interlaced. At least one of the conductive layers has a first doping segment having a first doping property and a second doping segment having a second doping property, the second doping property being different from the first doping property. The interface between the first doping segment and the second doping segment has a grain boundary.

10 Claims, 16 Drawing Sheets

SEMICONDUCTOR DEVICE AND MANUFACTURING METHOD OF THE SAME

BACKGROUND

1. Technical Field

The disclosure relates in general to a semiconductor device and a manufacturing method thereof, and particularly to a semiconductor device with doping regions and a manufacturing method thereof.

2. Description of the Related Art

With the development of semiconductor technology, varied semiconductor elements are invented. For example, memories, transistors and diodes are widely used in electric devices.

Conventionally, the doping regions in semiconductor elements are manufactured by implantation processes. However, as doping depths increase, the doping distribution may enlarge, and the doping concentration per unit volume decreases. Besides, as the doping regions diffuse and the doping distribution enlarges, the boundaries of the doping regions become less distinct, which affects the precision of the whole manufacturing process. In addition, in order to achieve the predetermined doping concentrations, the deeper regions may be applied with more implantation processes, and the doping concentrations for regions with different depths have to be different as well; as such, the manufacturing costs largely increase. Therefore, in the development of semiconductor technology, researchers having being trying to improve semiconductor elements.

SUMMARY

The disclosure is directed to a semiconductor device and a manufacturing method thereof. In the embodiments, different doping regions are manufactured in different manufacturing processes, accordingly, the doping distributions and the doping concentrations can be controlled precisely. As such, the miniature of device sizes can be achieved satisfactorily, the manufacturing costs can be greatly reduced, and the damage that may be caused by implantation processes to the semiconductor device can be prevented.

According to an embodiment of the present disclosure, a semiconductor device is provided. The semiconductor device includes a substrate and a stacked structure. The stacked structure is formed vertically on the substrate. The stacked structure comprises a plurality of conductive layers and a plurality of insulating layers, and the conductive layers and the insulating layers are interlaced. At least one of the conductive layers has a first doping segment and a second doping segment. The first doping segment has a first doping property, and the second doping segment has a second doping property. The first doping property is different from the second doping property. The interface between the first doping segment and the second doping segment has a grain boundary.

According to another embodiment of the present disclosure, a manufacturing method of a semiconductor device is provided. The manufacturing method includes the following steps: providing a substrate and forming a stacked structure vertically on the substrate. Forming of the stacked structure comprises the following steps: forming a plurality of conductive layers on the substrate; comprising forming a plurality of first doping segments and forming a plurality of second doping segments, wherein the first doping segments have a first doping property, the second doping segments have a second doping property, the first doping property is different from the second doping property, and the interface between the first doping segments and the second doping segments has a grain boundary; and forming a plurality of insulating layers on the substrate, the conductive layers and the insulating layers being interlaced.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a semiconductor device and a method of manufacturing the same are provided. In the embodiments, different doping regions are manufactured in different manufacturing processes, accordingly, the doping distributions and the doping concentrations can be controlled precisely. As such, the miniature of device sizes can be achieved satisfactorily, the manufacturing costs can be greatly reduced, and the damage that may be caused by implantation processes to the semiconductor device can be prevented. The following embodiments are for the purpose of elaboration only, not for limiting the scope of protection of the invention. Besides, secondary elements are omitted in the following embodiments to highlight the technical features of the invention.

Figure 1:
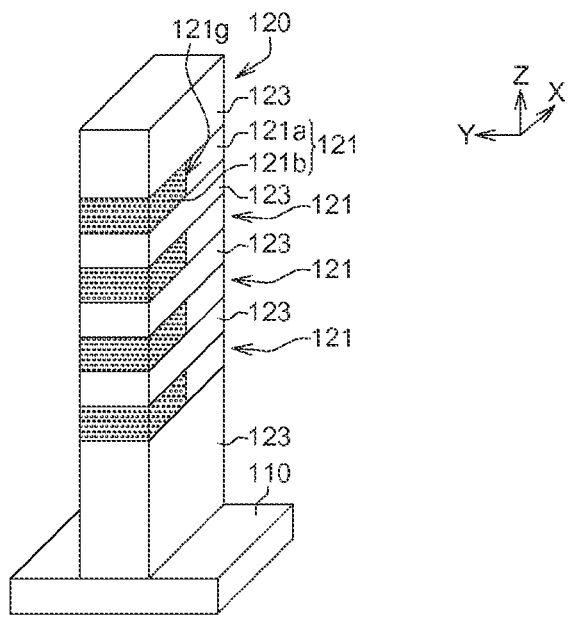
FIG. 1 is a stereoscopic diagram of a semiconductor device according to an embodiment of the present disclosure.

Referring to FIG. 1, a stereoscopic diagram of a semiconductor device 100 according to an embodiment of the present disclosure is shown. The semiconductor device 100 comprises a substrate 110 and a stacked structure 120 formed vertically on the substrate 110. The stacked structure 120 includes a plurality of conductive layers 121 and a plurality of insulating layers 123, and the conductive layers 121 and the insulating layers 123 are interlaced. At least one of the conductive layers 121 has a first doping segment 121a and a second doping segment 121b. The first doping segment 121a has a first doping property, the second doping segment 121b has a second doping property, and the first doping property is different from the second doping property. The interface 121g between the first doping segment 121a and the second doping segment 121b has a grain boundary.

In the embodiment, as shown in FIG. 1, all of the conductive layers 121 have the first doping segments 121a and the second doping segments 121b, and each of the first doping segments 121a is adjacent to each of the second doping segments 121b. However, whether or not all the conductive layers 121 have the first doping segments 121a and the second doping segments 121b may vary according to situations applied; for example, in alternative embodiments, only some of the conductive layers 121 have the first doping segments 121a and the second doping segments 121b, and the arrangements are not limited to the what is shown in FIG. 1.

In an embodiment, the material of the conductive layers 121 may include polysilicon. In an alternative embodiment, the material of the conductive layers 121 may include III-V compound, II-VI compound, or metal oxide. For example, the III-V compound may be GaAs or InGaAs, the II-VI compound may be CdTe or CdMnSe, and the metal oxide may be Indium Gallium Zinc Oxide (IGZO).

In an embodiment, the material of the first doping segment 121a and the material of the second doping segment 121b may independently comprise at least one of arsenic (As), phosphor (P), antimony (Sb), boron (B), carbon (C), or nitrogen (N). In an alternative embodiment, only one of the material of the first doping segment 121a or the material of the second doping segment 121b comprises at least one of arsenic, phosphor, antimony, boron, carbon, or nitrogen; that is, one of the two doping segments 121a and 121b is non-doping.

In an embodiment, the first doping property and the second doping property are doping type. That is, the doping types of the first doping segment 121a and the second doping segment 121a are different. For example, the first doping property may be one of N type doping or P type doping, and the second doping property is the other of N type doping or P type doping. When the first doping segment 121a and the second doping segment 121b are N type doping and P type doping, respectively, the interface between the two doping segments 121a and 121b forms a P-N junction, and the combination of the two doping segments 121a and 121b may be applied as a diode.

In another embodiment, the first doping property and the second doping property are doping concentration. That is, the doping concentrations of the first doping segment 121a and the second doping segment 121b are different. For example, the doping concentration of one of the first doping segment 121a and the second doping segment 121b may be larger than $1E19/cm^3$, while the doping concentration of the other may be very low, as low as equal or close to non-doping, or is $1E17 \sim 1E19/cm^3$. In the present embodiment, the doping types of the first doping segment 121a and the second doping segment 121b may be both N type doping, both P type doping, or an N type doping and a P type doping, respectively.

In an embodiment, the volume of the first doping segment 121a is different from the volume of the second doping segment 121b.

Referring to FIGS. 2A-2F, a manufacturing method of a semiconductor device according to an embodiment of the present disclosure is illustrated.

Figure 2A:
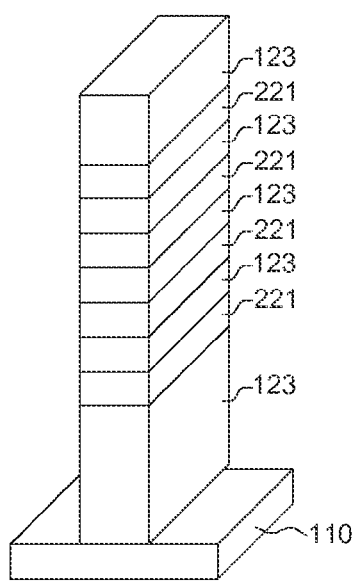
FIGS. 2A-2F illustrate a manufacturing method of a semiconductor device according to an embodiment of the present disclosure.

As shown in FIG. 2A, the substrate 110 is provided, the insulating layers 123 are formed, and a plurality of first doping layers 221 are formed. The first doping layers 221 have the first doping property. The first doping layers 221 and the insulating layers 123 are interlaced and vertically stacked on the substrate 110.

Figure 2B:
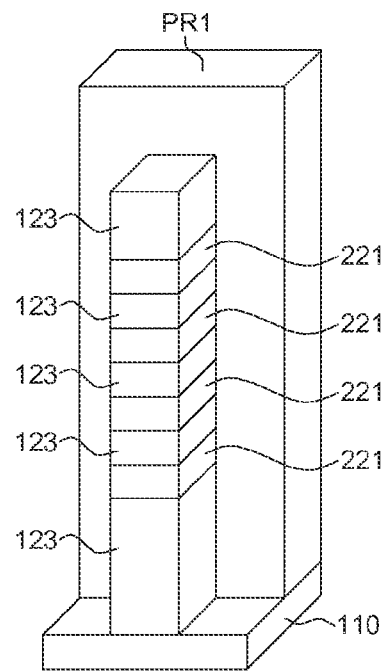
Figure 2C:
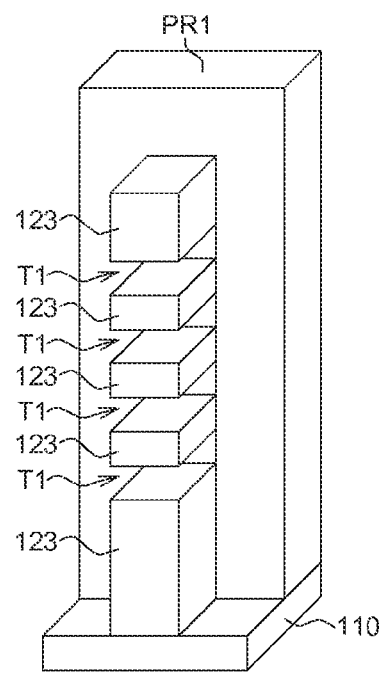
Figure 2D:
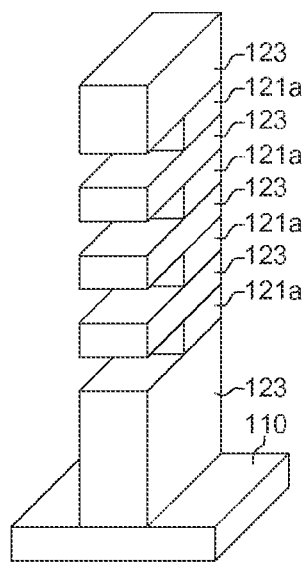

Referring to FIGS. 2B-2D, a plurality of trenches T1 and the first doping segments 121a are formed. Each of the trenches T1 is adjacent to each of the first doping segments 121a. In the embodiment, the manufacturing method of the trenches T1 and the first doping segments 121a includes such as the following steps.

As shown in FIG. 2B, a patterned photoresist PR1 is disposed on the stack formed from the first doping layers 221 and the insulating layers 123. The patterned photoresist PR1 covers a portion of the first doping layers 221.

As shown in FIG. 2C, the first doping layers 221 are partially removed for forming the trenches T1. The trenches T1 are formed between the insulating layers 123 and exposed from the patterned photoresist PR1. In the embodiment, the trenches T1 are formed by a photolithography etching process according to the patterned photoresist PR1. As the trenches T1 are formed, the first doping segments 121a, which are adjacent to the trenches T1, are formed as well.

As shown in FIG. 2D, the patterned photoresist PR1 is removed.

Figure 2E:
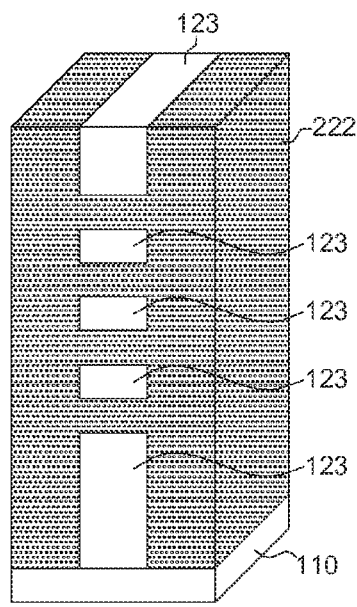
Figure 2F:
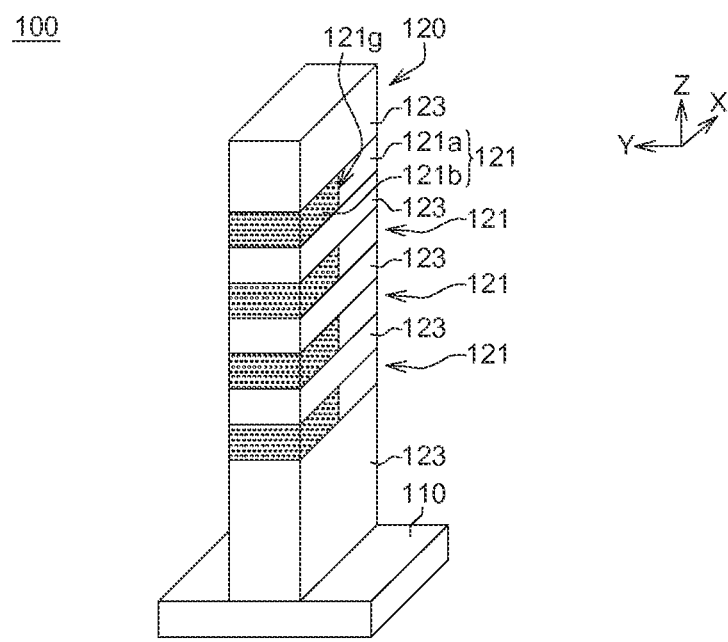

Next, referring to FIGS. 2E-2F, the second doping segments 121b are formed. The second doping segments 121b have the second doping property, which is different from the first doping property. In the embodiment, the manufacturing method of the second doping segments 121b includes such as the following steps.

As shown in FIG. 2E, a second doping material is filled into the trenches T1 for forming a second doping layer 222, and the second doping layer has the second doping property. In the present embodiment, the second doping layer 222 fills the trenches T2 and covers the side surfaces of the insulating layers 123. In the embodiment, the first doping property is different from the second doping property, and the two doping properties are such as doping types or doping concentrations.

As shown in FIG. 2F, the second doping material remained outside the trenches T1 is removed for forming the second doping segments 121b. In the present embodiment, the second doping layer 222 exposed from the trenches T1 is removed by such as a grinding process or an etching process. Since the first doping segments 121a and the second doping segments 121b are formed in two different manufacturing processes, the grains in the first doping segments 121a and the grains in the second doping segments 121b form a distinct grain boundary on the interface 121g between the first doping segments 121a and the second doping segments 121b. As shown in FIG. 2F, the first doping segments 121a and the second doping segments 121b form the conductive layers 121, and the conductive layers 121 and the insulating layers 123 are interlaced and formed vertically on the substrate 110. In the present embodiment, the volume of the second doping segments 121b is smaller than the volume of the first doping segments 121a. As such, the semiconductor device 100 as shown in FIG. 2F (FIG. 1) is formed.

According to the embodiments of the present disclosure, different doping segments are manufactured in different manufacturing steps, such that the ranges of each of the doping regions in the semiconductor device can be precisely defined along x, y, and z directions. As such, the boundaries between the doping regions are distinct, and the doping concentrations of each of the doping regions can be nicely controlled according to the situations applied. For example, when the first doping segment 121a and the second doping segment 121b are N type doping and P type doping, respectively, the interface between the two doping segments 121a and 121b forms an excellent P-N junction, and accordingly, the diode as-formed is provided with superior properties. Particularly, when the manufacturing processes according to the embodiments of the present disclosure are applied to 3D semiconductor devices, regardless of the depths (along z direction) of the doping regions, the predetermined doping concentrations and doping ranges can be precisely controlled and achieved.

Moreover, when doping regions with different doping properties are manufactured according to the embodiments of the present disclosure, the undesired doping diffusion does not occur, especially along x and y directions. As such, the miniature of device sizes can be achieved satisfactorily, multiple implantation processes are not required, such that the manufacturing costs can be greatly reduced, and the damage that may be caused by implantation processes to the semiconductor device can be prevented.

Figure 3A:
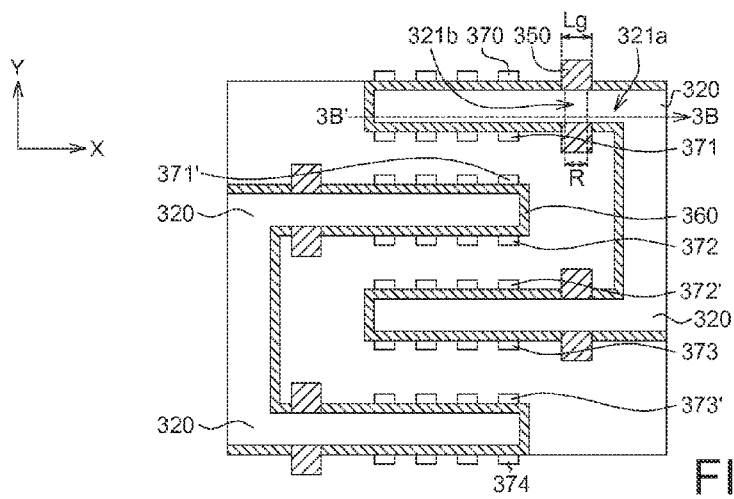
FIG. 3A is a top view of a semiconductor device according to another embodiment of the present disclosure.
Figure 3B:
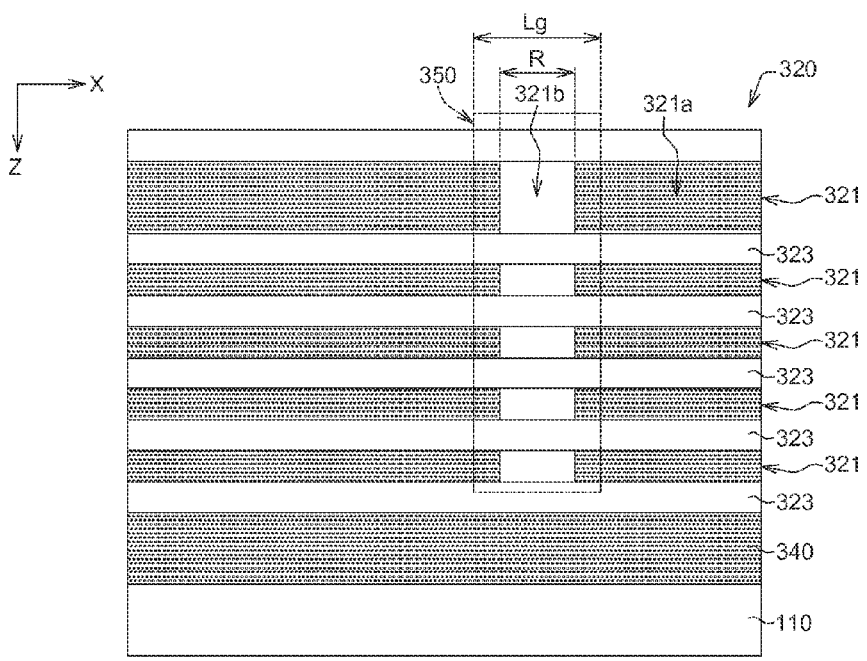
FIG. 3B is a cross-sectional view along the cross-sectional line 3B-3B' of FIG. 3A.

Referring to FIGS. 3A-3B, FIG. 3A is a top view of a semiconductor device 300 according to another embodiment of the present disclosure, and FIG. 3B is a cross-sectional view along the cross-sectional line 3B-3B' of FIG. 3A.

As shown in FIGS. 3A-3B, in the semiconductor device 300, the doping concentration of the second doping segment 321b is lower than the doping concentration of the first doping segment 321a. The semiconductor device 300 may further include a gate structure 350, which is disposed corresponding to the second doping segment 321b having the lower doping concentration. In the present embodiment, the volume (area) of the second doping segment 321b is smaller than the volume (area) of the first doping segment 321a. In an alternative embodiment, the doping concentration of the second doping segment 321b is higher than the doping concentration of the first doping segment 321a, accordingly, the gate structure 350 is disposed corresponding to the first doping segment 321a having the lower doping concentration. In the following description, the second doping segment 321b having the lower doping concentration is taken as an example, however, the example is for the purpose of elaboration only, not for limiting the scope of protection of the invention.

In the present embodiment, the semiconductor device 300 is such as a 3D memory structure. As shown in FIGS. 3A-3B, the semiconductor device 300 may further include a plurality of the stacked structures 320, a conductive layer 340, a charge trapping layer 360, and a plurality of ultra-thin channels 370, 371, 371', 372, 372', 373, 373' and 374 formed at outsides of the charge trapping layer 360 and lined between the adjacent stacked structures 320. The current flows in the ultra-thin channels along the y direction, and the ultra-thin channels are controlled by word line selectors. The first doping segments 321a are such as the word lines of the memory structure, the word lines connecting to the ultra-thin channels. The conductive layer 340 is such as a bottom gate layer. The gate structures 350 are such as word line selectors, which are disposed at two sides of one end of each stacked structure 320 and electrically connected to the charge trapping layer 360. The 3D memory structure is operated by using the word line selectors (gate structure 350) to select corresponding word lines (first doping segment 321a).

As shown in FIG. 3B, the conductive layer 340 may be formed together with the formation of the first doping layers for manufacturing the conductive layers 321, the first doping layers having a as high doping concentration as that of the first doping segments 321a. That is, the material of the conductive layer 340 is the same as the material of the first doping layers. And then, among all the conductive layers (the conductive layer 340 and the first doping layers), only some are manufactured to form the first doping segments 321a and the second doping segments 321b, for forming the conductive layers 321. The conductive layer 340 does not include more than one doping segment, which is due to the high doping concentration requirement for the bottom gate layer.

In order to turn off the word line selectors (gate structures 350), the doping concentration of the portions (second doping segments 312b) of the conductive layers 321 between the insulating layers 323 should be low doping or non-doping. Therefore, the gate structures 350 are disposed corresponding to the second doping segments 321b having the lower doping concentrations. In the present embodiment, the gate structure 350 is such as of a single gate design. However, the design of the gate structure 350 may vary depending on the situations applied, which may also be a double gate design or a surrounding gate design, and not limited to the examples aforementioned.

In the embodiment, as shown in FIGS. 3A-3B, the gate structure 350 has a gate length Lg parallel to and longer than a length R of the second doping segment 321b having the lower doping concentration. In the embodiment, as shown in FIGS. 3A-3B, the length R of the second doping segment 321b is fully located within the range which the gate length Lg covers.

According to the embodiments of the present disclosure, distinctly interfaces (grain boundaries) can be defined between the doping segments (e.g. the first doping segment 321a and the second doping segment 321b. Still, subsequent thermal treatments may be performed to the semiconductor device 300, carriers may diffuse, and the distinctly defined interfaces may be affected by the diffusion. The carriers diffused across the interfaces may be conductive at the turn-off state, thereby generating resistance in series, which may cause RC delay issues. As shown in FIGS. 3A-3B, the gate length Lg is longer than the length R of the second doping segment 321b, and the length R of the second doping segment 321b is fully located within the range which the gate length Lg covers. As such, the regions where the carriers may diffuse to are effectively covered by the gate structure 350, thereby improving the RC delay issues.

Referring to FIGS. 4A-12C, a manufacturing method of a semiconductor device 500 according to a further embodiment of the present disclosure is illustrated.

Figure 4A:
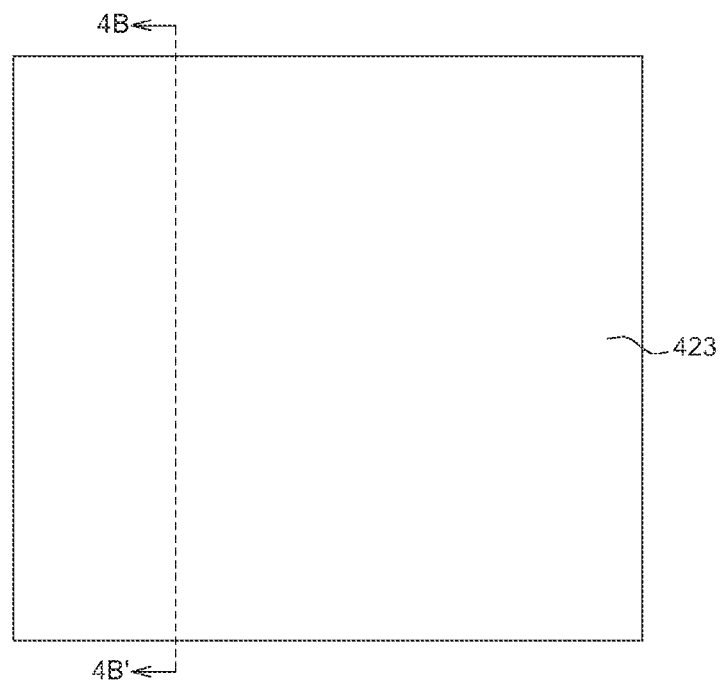
FIGS. 4A-12C illustrate a manufacturing method of a semiconductor device according to a further embodiment of the present disclosure.
Figure 4B:

Referring to FIGS. 4A-4B (FIG. 4B is a cross-sectional view along the cross-sectional line 4B-4B' of FIG. 4A), the substrate 110 is provided, the insulating layers 423 are formed, and the first doping layers 621 are formed. The first doping layers 621 have the first doping property. The first doping layers 621 and the insulating layers 423 are interlaced and vertically formed on the substrate 110. As shown in FIG. 4B, a bottom oxide layer 428 may be further formed between the substrate 110 and the stack formed from the first doping layers 621 and the insulating layers 423.

Referring to FIGS. 5A-7B, a plurality of trenches T3 and the first doping segments 421a are formed. Each of the trenches T3 is adjacent to each of the first doping segments 421a. In the embodiment, the manufacturing method of the trenches T3 and the first doping segments 421a includes such as the following steps.

Figure 5A:
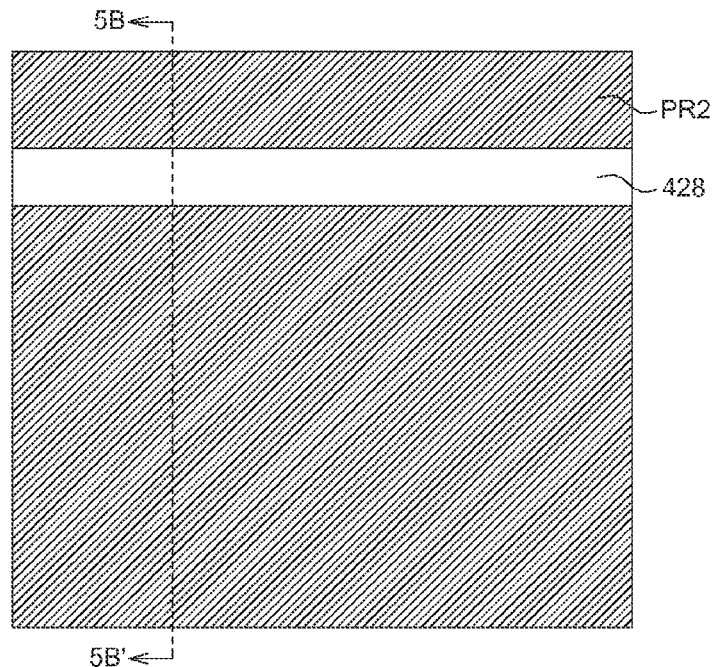
Figure 5B:
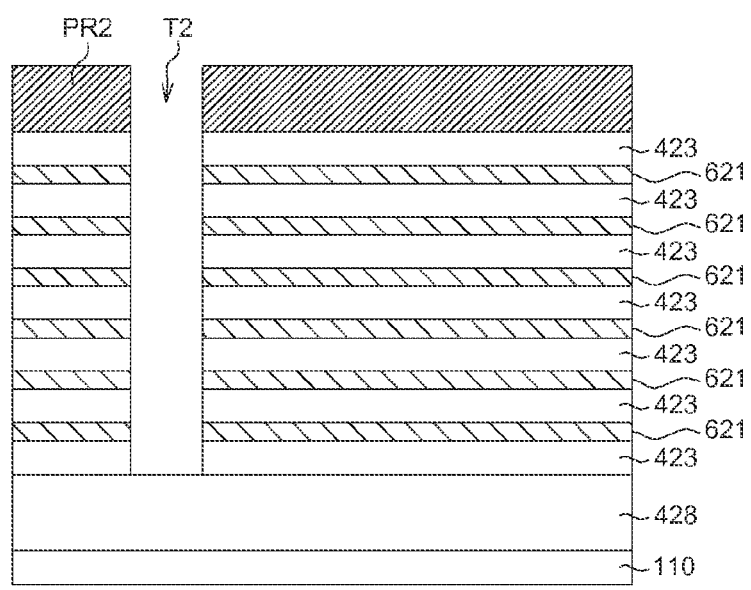

As shown in FIGS. 5A-5B (FIG. 5B is a cross-sectional view along the cross-sectional line 5B-5B' of FIG. 5A), a patterned photoresist PR2 is disposed on the stack formed from the first doping layers 621 and the insulating layers 423. And then, the stack formed from the first doping layers 621 and the insulating layers 423 is etched according to the patterned photoresist PR2 for forming a trench T2. The trench T2 extends vertically toward the surface of the bottom oxide layer 428.

Figure 6A:
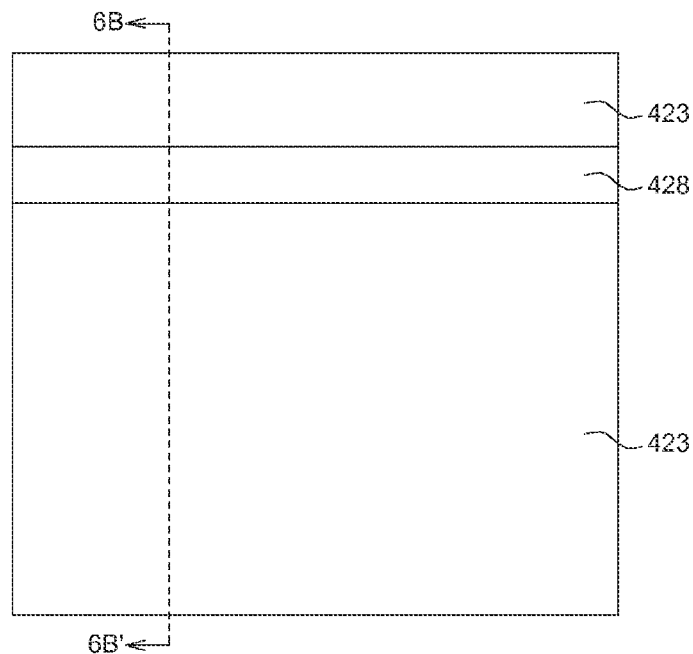
Figure 6B:
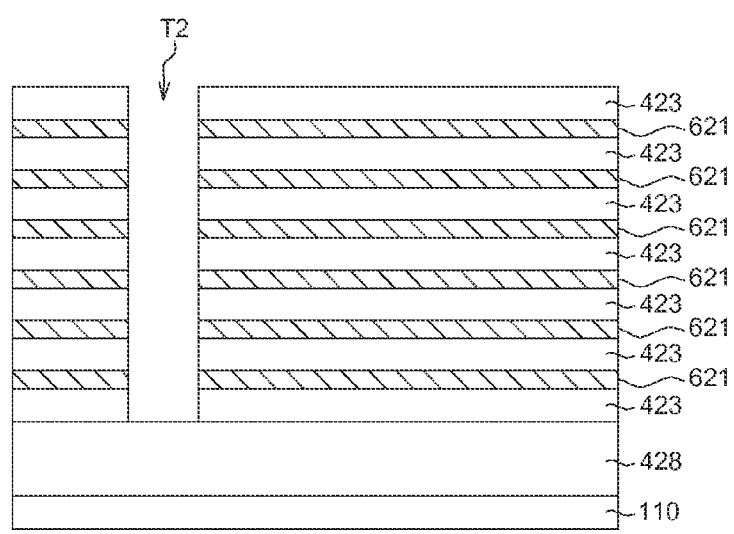

As shown in FIGS. 6A-6B (FIG. 6B is a cross-sectional view along the cross-sectional line 6B-6B' of FIG. 6A), the patterned photoresist PR2 is removed.

Figure 7A:
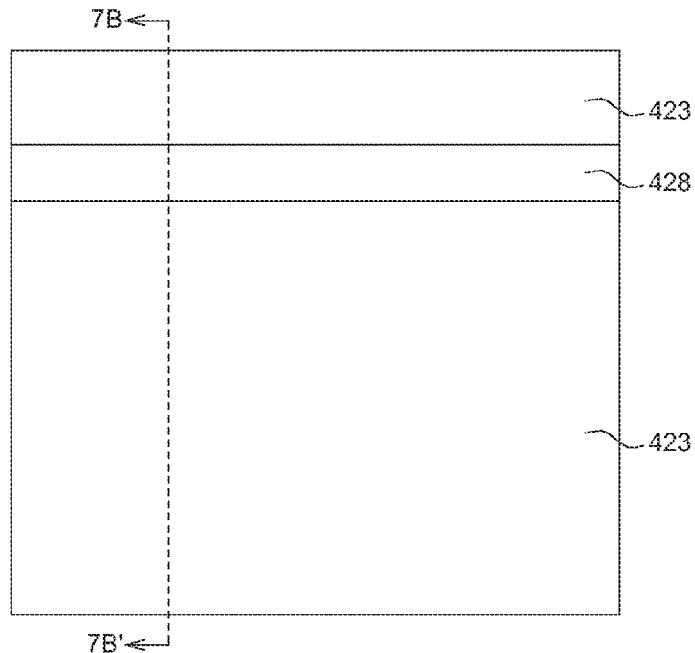
Figure 7B:
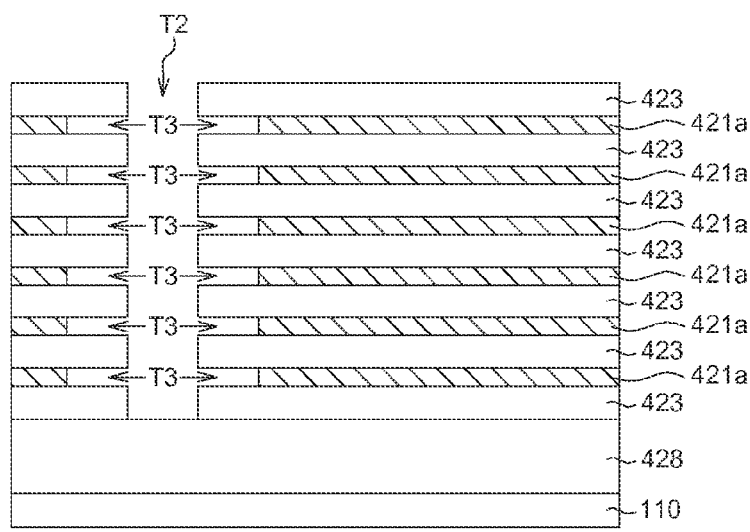

As shown in FIGS. 7A-7B (FIG. 7B is a cross-sectional view along the cross-sectional line 7B-7B' of FIG. 7A), the first doping layers 621 are partially removed for forming the trenches T2 and the first doping segments 421a. The trenches T3 are formed between the insulating layers 423, and each of the trenches T3 is adjacent to each of the first doping segments 421a. In the embodiment, the first doping layers 621 are partially removed by a selective isotropic etching process, such as a chemical direct etching process (CDE). The etching solution has a high etching selectivity of the first doping layers 621 to the insulating layers 423.

Next, referring to FIGS. 8A-9B, the second doping segments 421b are formed. The second doping segments 421 have the second doping property, which is different from the first doping property. In the embodiment, the manufacturing method of the second doping segments 421b includes such as the following steps.

Figure 8A:
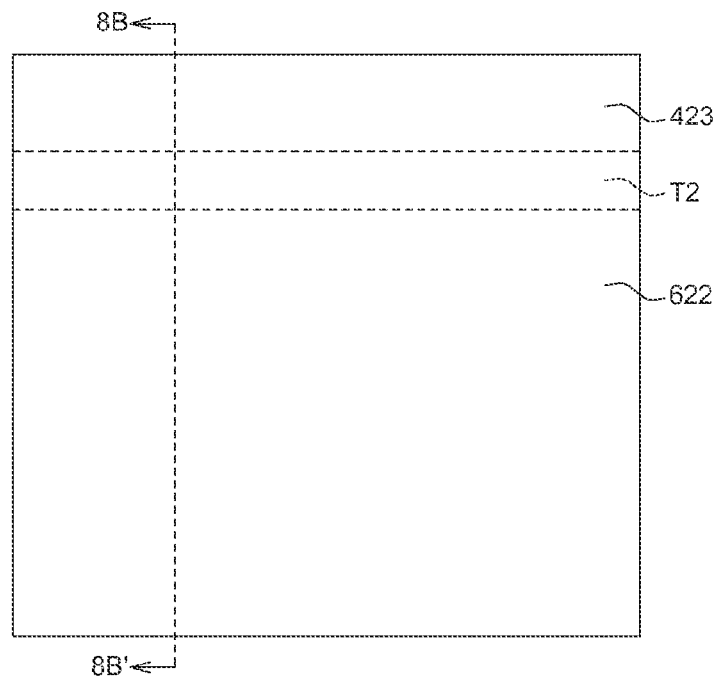
Figure 8B:
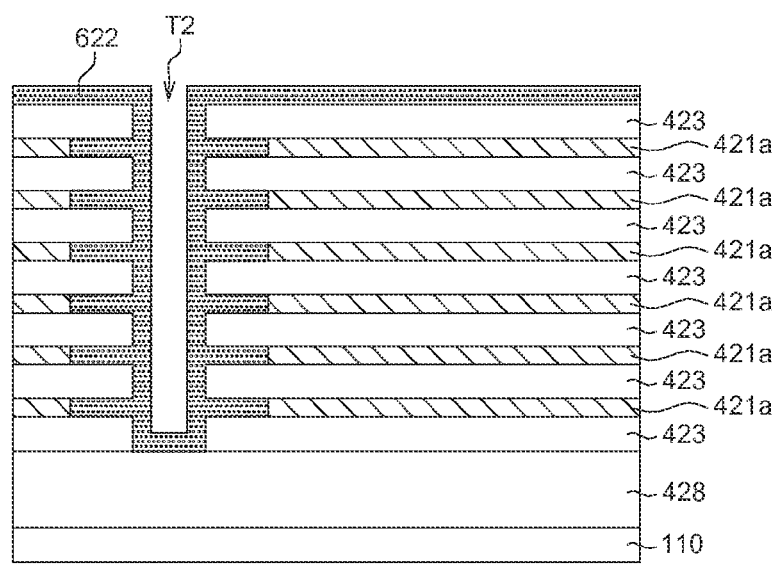

As shown in FIGS. 8A-8B (FIG. 8B is a cross-sectional view along the cross-sectional line 8B-8B' of FIG. 8A), the second doping material is filled into the trenches T3 and deposited on the surface of the topmost insulating layer 423, for forming the second doping layer 622. The second doping material has the second doping property. In the present embodiment, the second doping layer 622 fills the trenches T3 and covers the whole surface of the insulating layers 423. In the embodiment, the first doping property is different from the second doping property, and the two doping properties are such as doping types or doping concentrations.

Figure 9A:
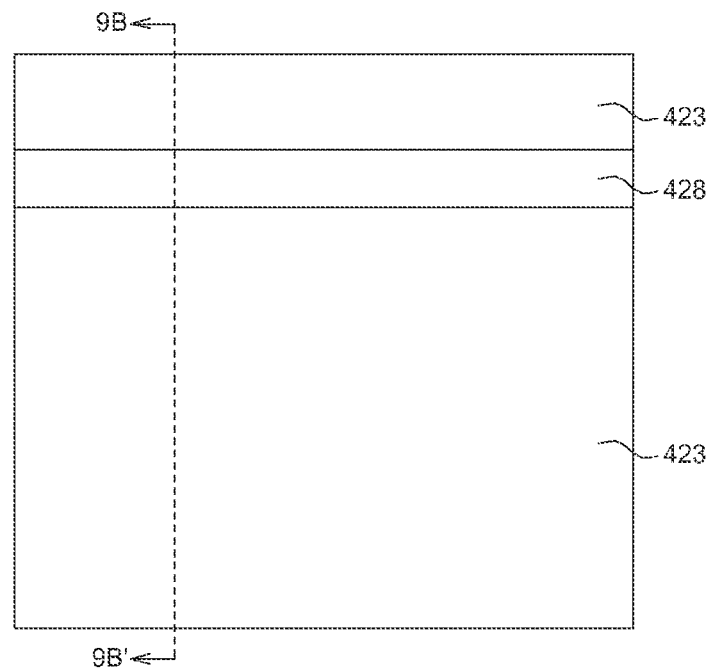
Figure 9B:
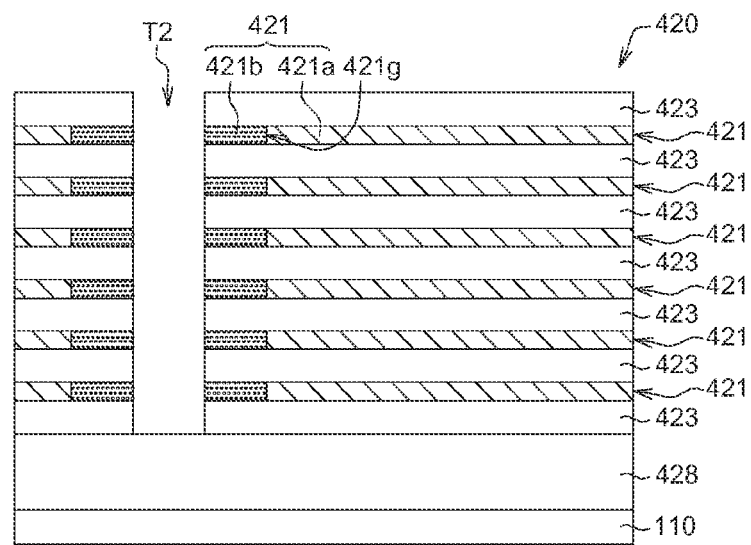

As shown in FIGS. 9A-9B (FIG. 9B is a cross-sectional view along the cross-sectional line 9B-9B' of FIG. 9A), the second doping material remained and exposed outside the trenches T3 is removed for forming the second doping segments 421b. In the present embodiment, the second doping layer 622 exposed from the trenches T3 is removed by such as a CDE process or a blanking etching process. Since the first doping segments 421a and the second doping segments 421b are formed in two different manufacturing processes, the grains in the first doping segments 421a and the grains in the second doping segments 421b form a distinct grain boundary on the interface 421g between the first doping segments 121a and the second doping segments 121b. As shown in FIG. 9B, the first doping segments 421a and the second doping segments 421b form the conductive layers 421, and the conductive layers 421 and the insulating layers 423 are interlaced and formed vertically on the substrate 110. In the present embodiment, the volume of the second doping segments 421b is smaller than the volume of the first doping segments 421a.

Figure 10A:
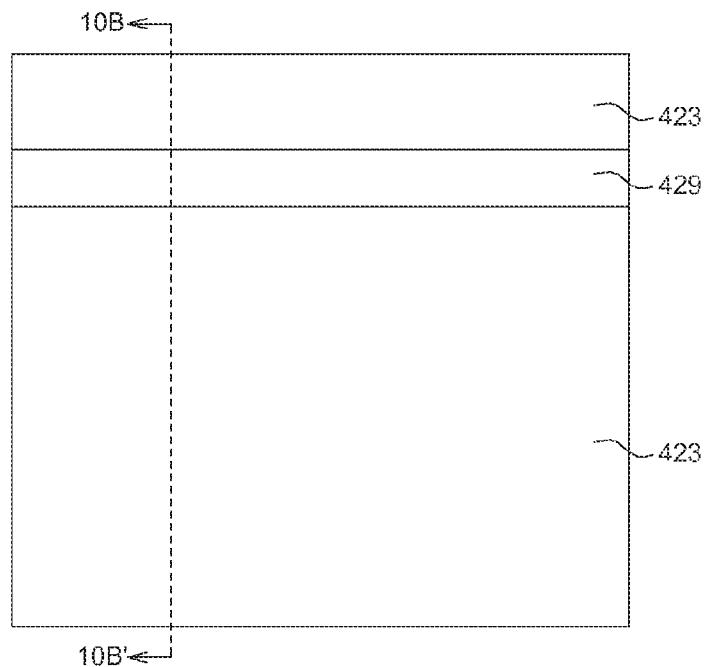
Figure 10B:
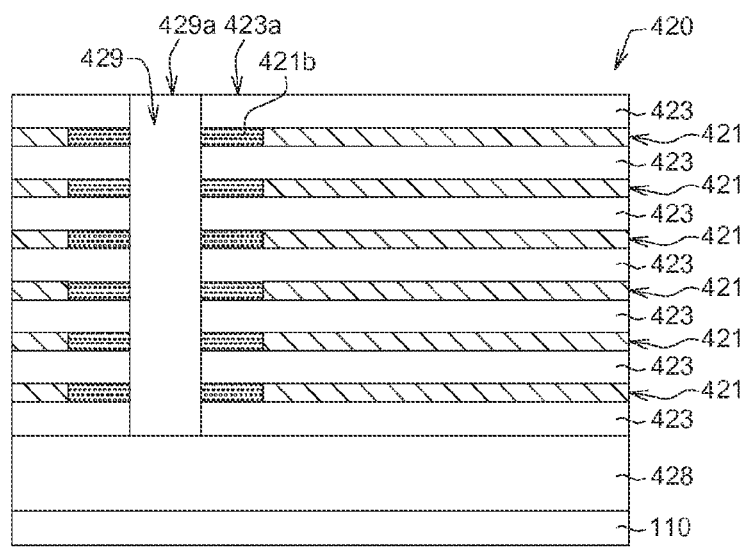

Next, as shown in FIGS. 10A-10B (FIG. 10B is a cross-sectional view along the cross-sectional line 10B-10B' of FIG. 10A), an oxide layer 429 is formed in the trench T2, and the top surface of the oxide layer 429 is ground for aligning the top surface 429a of the oxide layer 429 and the top surface 423a of the topmost oxide layer 423. In the embodiment, the oxide layer 429 is ground by such as a CMP process.

Figure 11A:
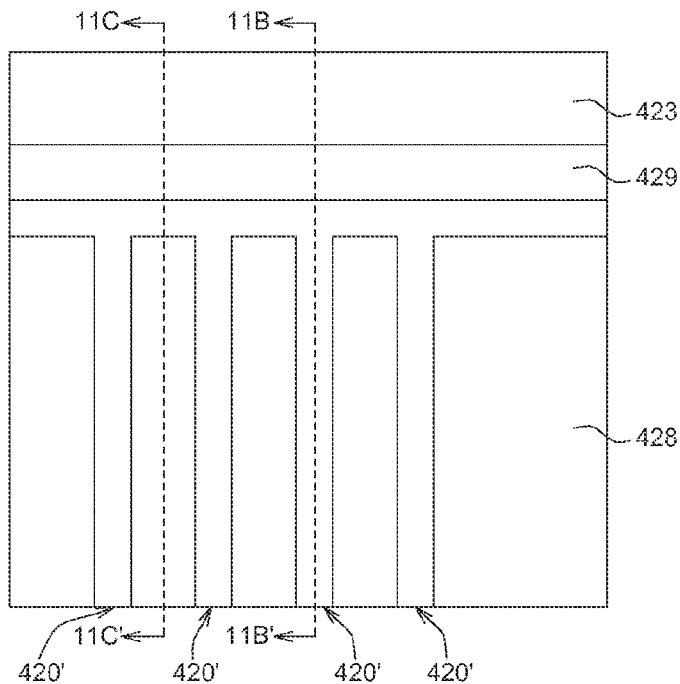
Figure 11B:
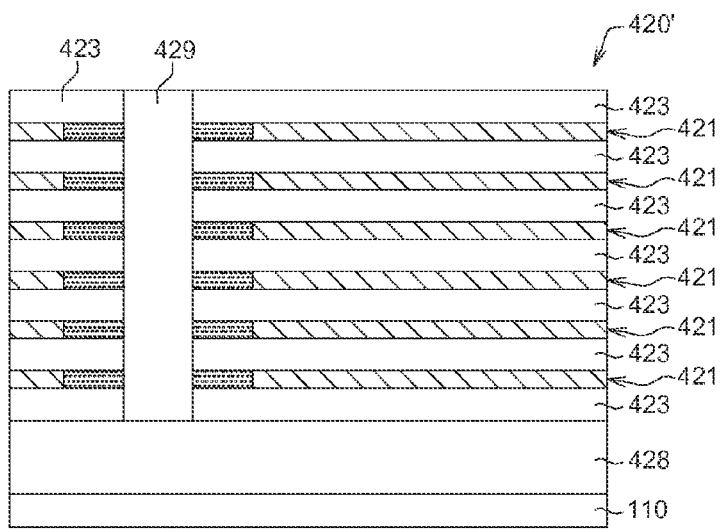
Figure 11C:
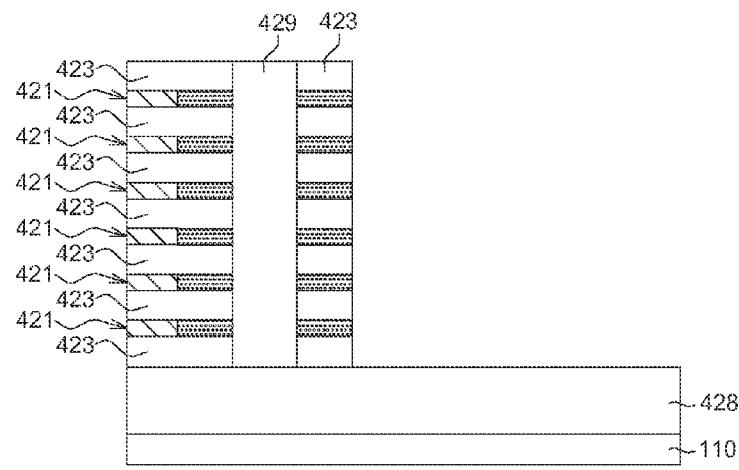

Next, as shown in FIGS. 11A-11C (FIG. 11B is a cross-sectional view along the cross-sectional line 11B-11B' of FIG. 11A, and FIG. 11C is a cross-sectional view along the cross-sectional line 11C-11C' of FIG. 11A), the stacked structure 420 is patterned for forming a plurality of stacked strips 420'.

Figure 12A:
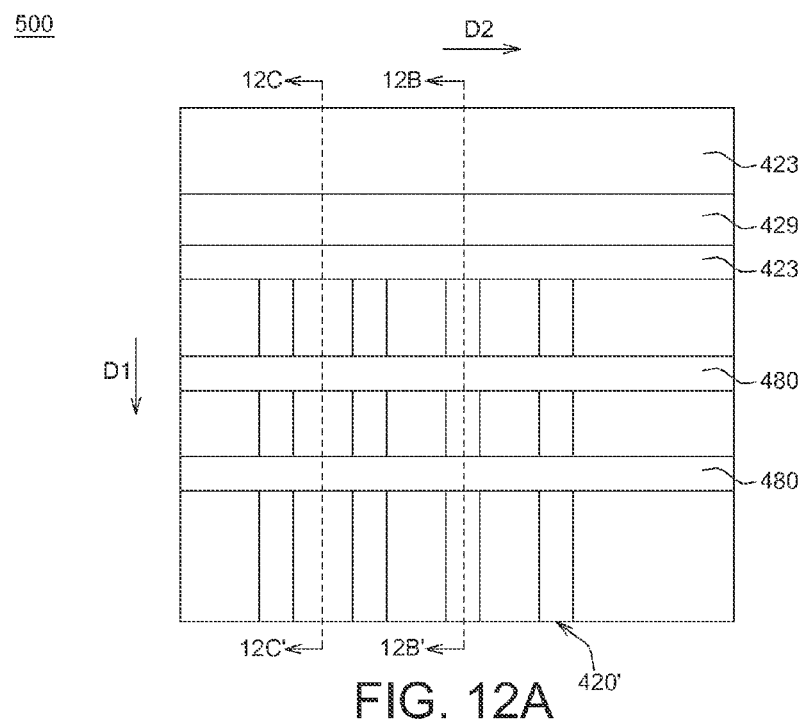
Figure 12B:
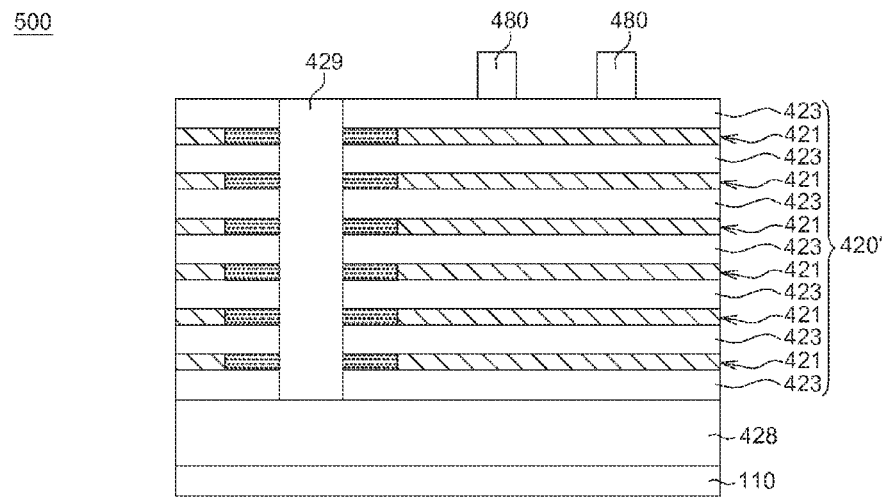
Figure 12C:
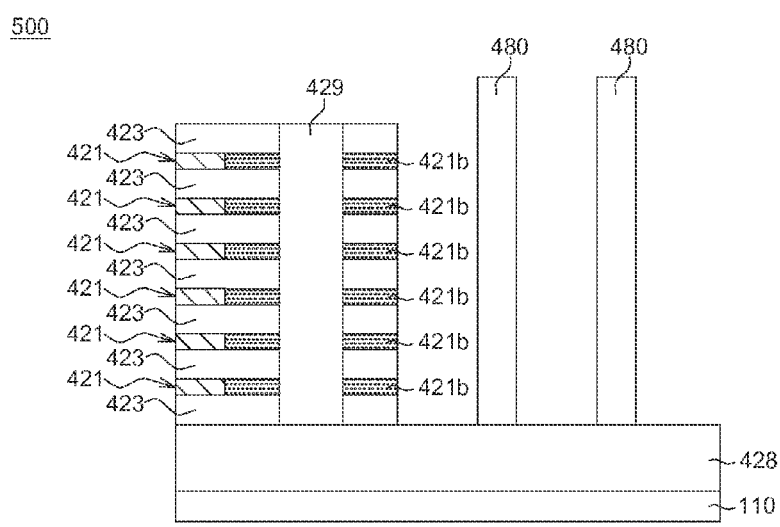

Next, as shown in FIGS. 12A-12C (FIG. 12B is a cross-sectional view along the cross-sectional line 12B-12B' of FIG. 12A, and FIG. 12C is a cross-sectional view along the cross-sectional line 12C-12C' of FIG. 12A), a charge trapping layer (not shown) is formed on the stacked strips 420', and a plurality of striped conductive structures 480 are formed on the stacked strips 420'. The stacked strips 420' are extend in a direction D1 perpendicular to a direction D2 which the striped conductive structures 480 are extended in. As such, the semiconductor device 500 as shown in FIGS. 12A-12C is formed.

In an embodiment, the semiconductor device 500 is such as a 3D memory device, as shown in FIGS. 12A-12C, for example, the stacked strips 420' are bit lines, and the striped conductive structures 480 are the main body of word lines.

Figure 13:
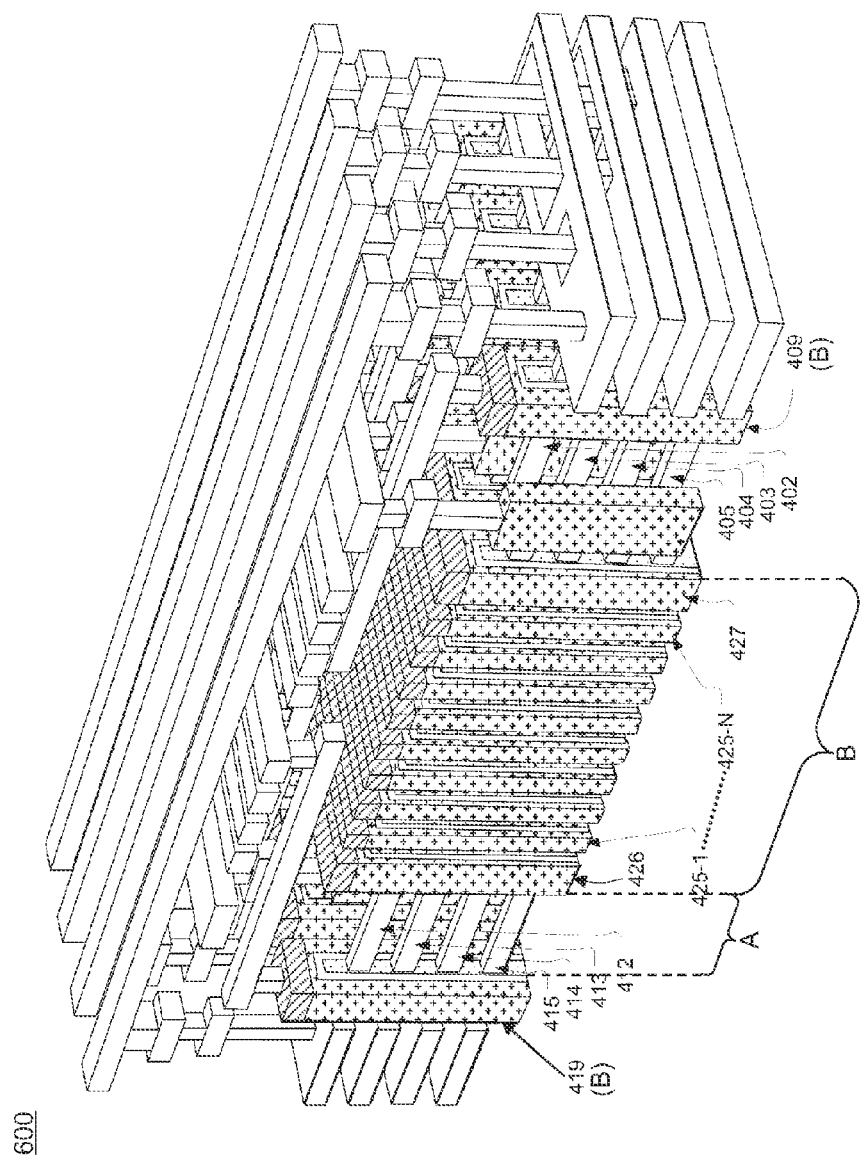
FIG. 13 is a stereoscopic diagram of a 3D vertical gate memory array.

Referring to FIG. 13, a stereoscopic diagram of a 3D vertical gate memory array 600 is shown. Referring to FIGS. 12A-12C and 13, the manufacturing method of the semiconductor device 500 can be applied to the manufacturing process of the memory array 600. For example, the conductive layers 421 of the semiconductor device 500 can be regarded as the semiconductor strips 402, 403, 404, 405, 412, 413, 414, 415 of the memory array 600, the striped conductive structures 480 can be regarded as the word lines 425N to 425-1. In the present embodiment, the semiconductor strips 402-405, 412-415 of the memory array 600 have a region B, which corresponds to the area covered by at least the SSL gate structures 409/419, gate select lines 426/427, and word lines 425N to 425-1. The region B is a gate control region and should be low doping or non-doping. The semiconductor strips 402-405, 412-415 also have a region A, which corresponds to the area uncovered and not controlled by at least the SSL gate structures 409/419, gate select lines 426/427, and word lines 425N to 425-1. The region A does not have inversion layers and should have a high doping concentration. The semiconductor strips 402-405, 412-415 in the region B all have channels, and the current flows in the channels along the direction in which the semiconductor strips 402-405, 412-415 are extended.

In the present embodiment, in the semiconductor device 500, the doping concentration of the second doping segments 421b is higher than the doping concentration of the first doping segments 421a. Referring to FIGS. 12A-12C and 13, the second doping segments 421b having a higher doping concentration can be used to form the region A of the semiconductor strips 402-405, 412-415 of the memory array 600, and the first doping segments 421a having a lower doping concentration can be used to form the region B of the semiconductor strips 402-405, 412-415. In other words, according to the embodiments of the present disclosure, the manufacturing method of the semiconductor strips 402-405, 412-415 includes such as: forming a plurality of semiconductor strips having a low doping concentration (similar to the process of forming the first doping layers 621), defining regions A and B, and replacing the low doping segments originally in the region A of the semiconductor strips with a high doping semiconductor material (similar to the process of forming the second doping segments 421b), for forming the semiconductor strips 402-405, 412-415 with the high doping region A and the low doping region B. As such, the interface between the region A with a high doping concentration and the region B with a low doping concentration has a grain boundary and is distinctly defined, the doping concentrations and the doping ranges of the two regions can be well-controlled, and the manufacturing costs can be greatly reduced since multiple implantation processes are not required.

Moreover, the memory array 600 is manufactured according to the embodiments of the present disclosure (e.g. the manufacturing process of the semiconductor device 500), the region B of the semiconductor strips 402-405, 412-415 is fully located within the gate control region (e.g. the range which at least the SSL gate structures 409/419, gate select lines 426/427, and word lines 425N to 425-1 cover). As such, the regions where the carriers of the region B may diffuse to are effectively covered by the gate control region, thereby effectively improving the RC delay issues.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a substrate; and
a stacked structure vertically formed on the substrate, comprising:
a plurality of conductive layers; and
a plurality of insulating layers, the conductive layers and the insulating layers being interlaced;
wherein each of the conductive layers has a first doping segment and a second doping segment, the first doping segments have a first doping property, the second doping segments have a second doping property, the first doping property is different from the second doping property, and each of the interfaces between the first doping segments and the second doping segments has a grain boundary.

2. The semiconductor device according to claim 1, wherein at least one of the first doping segment or the second doping segment comprises at least one of arsenic (As), phosphor (P), antimony (Sb), boron (B), carbon (C), or nitrogen (N).

3. The semiconductor device according to claim 1, wherein the first doping property and the second doping property are doping concentration, the doping concentration of one of the first doping segment and the second doping segment is 1E17~1E19/cm3, and the doping concentration of the other one of the first doping segment and the second doping segment is larger than 1E19/cm3.

4. The semiconductor device according to claim 1, wherein the first doping property and the second doping property are doping type, and the first doping property and the second doping property are independently N type doping or P type doping, respectively.

5. The semiconductor device according to claim 1, wherein the volume of the first doping segment is different from the volume of the second doping segment.

6. The semiconductor device according to claim 1, wherein the conductive layers comprise polysilicon.

7. The semiconductor device according to claim 1, wherein the conductive layers comprise at least one of III-V compound, II-VI compound, or metal oxide.

8. The semiconductor device according to claim 1, wherein the doping concentration of the second doping segment is different from the doping concentration of the first doping segment, the semiconductor device further comprises a gate structure disposed corresponding to one, having the lower doping concentration, of the first doping segment or the second doping segment.

9. The semiconductor device according to claim 8, wherein the gate structure has a gate length parallel to and longer than a length of the one, having the lower doping concentration, of the first doping segment or the second doping segment.

10. The semiconductor device according to claim 8, wherein the gate structure is of a single gate design, a double gate design, or a surrounding gate design.

* * * * *